United States Patent
Yu et al.

(10) Patent No.: US 12,227,685 B2
(45) Date of Patent: Feb. 18, 2025

(54) RARE EARTH HALIDE SCINTILLATION MATERIAL

(71) Applicants: GRIREM ADVANCED MATERIALS CO., LTD., Beijing (CN); GRIREM HI-TECH CO., LTD., Heibei (CN); Rare Earth Functional Materials (Xiong 'an) Innovation Center Co., Ltd., Hebei (CN)

(72) Inventors: Jinqiu Yu, Beijing (CN); Liang Luo, Beijing (CN); Chengpeng Diao, Beijing (CN); Lei Cui, Beijing (CN); Hao Wu, Beijing (CN); Huaqiang He, Beijing (CN)

(73) Assignees: GRIREM ADVANCED MATERIALS CO., LTD., Beijing (CN); Rare Earth Functional Materials (Xiong'an) Innovation Center Co., Ltd., Baoding (CN); GUOKE RE ADVANCED MATERIALS CO., LTD., Langfang (CN)

( * ) Notice: Subject to any disclaimer, the term of this patent is extended or adjusted under 35 U.S.C. 154(b) by 341 days.

(21) Appl. No.: 17/441,927

(22) PCT Filed: Oct. 30, 2020

(86) PCT No.: PCT/CN2020/125172
§ 371 (c)(1),
(2) Date: Sep. 22, 2021

(87) PCT Pub. No.: WO2021/083316
PCT Pub. Date: May 6, 2021

(65) Prior Publication Data
US 2022/0372368 A1 Nov. 24, 2022

(30) Foreign Application Priority Data
Nov. 1, 2019 (CN) .......................... 201911058510.3

(51) Int. Cl.
| | | |
|---|---|---|
| C09K 11/77 | (2006.01) | |
| C01F 17/253 | (2020.01) | |
| C30B 11/02 | (2006.01) | |
| C30B 29/12 | (2006.01) | |
| G01T 1/202 | (2006.01) | |
| G01T 1/36 | (2006.01) | |

(52) U.S. Cl.
CPC ........ *C09K 11/7772* (2013.01); *C01F 17/253* (2020.01); *C30B 11/02* (2013.01); *C30B 29/12* (2013.01); *G01T 1/202* (2013.01); *G01T 1/2023* (2013.01); *G01T 1/362* (2013.01); *C01P 2002/54* (2013.01)

(58) Field of Classification Search
CPC ... C09K 11/7772; C01F 17/253; C30B 11/02; C30B 29/12; G01T 1/202; G01T 1/361; G01T 1/2023
See application file for complete search history.

(56) References Cited

U.S. PATENT DOCUMENTS

| | | | |
|---|---|---|---|
| 7,405,404 B1 | 7/2008 | Shah | |
| 11,685,860 B2 * | 6/2023 | Yu | ........................... C30B 29/12 250/362 |

FOREIGN PATENT DOCUMENTS

| | | | |
|---|---|---|---|
| CN | 102560647 | A | 7/2012 |
| CN | 103695002 | A | 4/2014 |
| CN | 109988577 | A | 7/2019 |
| CN | 110938433 | A | 3/2020 |
| CN | 110938868 | A | 3/2020 |
| CN | 110982527 | A | 4/2020 |
| JP | 2010-285559 | * | 12/2010 |
| JP | 2010285559 | A | 12/2010 |
| JP | 2011225742 | A | 11/2011 |
| WO | 2019128388 | A1 | 7/2019 |
| WO | 2019168169 | A1 | 9/2019 |
| WO | WO 2019/168169 | * | 9/2019 |

OTHER PUBLICATIONS

English language version of Written Opinion for PCT/CN2020/125172, Feb. 1, 2021.*
Englsih translation for WO 2019/168169, Sep. 6, 2019.*
International Search Report of PCT/CN2020/125172.
Written Opinion issued in corresponding PCT Application No. PCT/CN2020/125172, dated Feb. 1, 2021.

* cited by examiner

*Primary Examiner* — C Melissa Koslow
(74) *Attorney, Agent, or Firm* — Westbridge IP LLC

(57) ABSTRACT

The present invention relates to a rare earth halide scintillating material. The material has a general chemical formula $La_{1-x}Ce_xBr_{3+y}$, wherein $0.001 \leq x \leq 1$, and $0.0001 \leq y \leq 0.1$. The rare earth halide scintillating material involved in the present invention has excellent scintillation properties of high light output, high energy resolution, and fast decay.

11 Claims, No Drawings

RARE EARTH HALIDE SCINTILLATION MATERIAL

CROSS-REFERENCE TO RELATED APPLICATIONS

This Application is a national stage application of PCT/CN2020/125172. This application claims priorities from PCT Application No. PCT/CN2020/125172, filed Oct. 30, 2020, and from the Chinese patent application 201911058510.3 filed Nov. 1, 2019, the content of which are incorporated herein in the entirety by reference.

TECHNICAL FIELD OF THE INVENTION

The present invention relates to the field of inorganic scintillation materials, and more particularly to a rare earth halide scintillation material.

BACKGROUND OF THE INVENTION

Scintillation materials can be used for the detection of high-energy rays such as α-rays, γ-rays, X-rays, and high-energy particles such as neutrons, and are widely applied in nuclear medicine, high-energy physics, safety inspections, oil logging, and other fields.

Scintillation materials are typically applied in the form of single crystals, and also in ceramic or other forms in some cases.

Different application fields have different performance requirements for scintillation materials. But for most application fields, it is desirable for scintillation materials to have a light yield as high as possible, a decay time as short as possible, and an energy resolution as high as possible. Especially for nuclear medicine imaging devices such as positron emission tomography (PET), these parameters are critical to the imaging quality.

The $LaBr_3$:Ce crystal disclosed by E. V. D. van Loef et al. in 2001 has a high light yield (>60,000 ph/MeV), a short decay time (<30 ns), and a high energy resolution (about 3%@662 keV) and is an excellent scintillation material.

The luminescence center of $LaBr_3$:Ce crystal is $Ce^{3+}$. The prior art uses alkaline earth metal ions for doping, which can further improve the performances of $CeBr_3$:Ce crystals such as the energy resolution and the energy response linearity. In fact, the method has also been used to improve the performances of $Ce^{3+}$-activated crystals such as lutetium oxyorthosilicate and lutetium-yttrium oxyorthosilicate. However, alkaline earth metal ions are a heterogeneous impurity after all, and have a difference in radius and valence from rare earth ions in terms. This doping is prone to cause crystal growth defects and would cause inconsistent doping concentrations of alkaline earth metal ions in different parts of the crystal due to the segregation phenomenon, which in turn affects the uniformity of crystal performance.

SUMMARY OF THE INVENTION

The objective of the present invention is to further improve the performance of the $LaBr_3$:Ce scintillation material through composition adjustment and control, so as to obtain a new material with more excellent comprehensive performance, and to apply the new material in different scenarios.

To achieve the above objective, the first aspect of the present invention provides a rare earth halide scintillation material having the chemical formula of $La_{1-x}Ce_xBr_{3+y}$, wherein $0.001 \leq x \leq 1$, $0.0001 \leq y \leq 0.1$.

In a further embodiment, $0.005 \leq x \leq 0.1$, $0.001 \leq y \leq 0.05$.

In a further embodiment, $x=1$, $0.001 \leq y \leq 0.05$.

In a further embodiment, the rare earth halide scintillation material contains both $Ce^{3+}$ and $Ce^{4+}$ at the same time.

In a further embodiment, the rare earth halide scintillation material is a single crystal.

In a further embodiment, the rare earth halide scintillation material is obtained by adopting a Bridgman method for growth.

The second aspect of the present invention provides a scintillation detector including the rare earth halide scintillation material as previously described.

The third aspect of the present invention provides a PET imager comprising the scintillation detector as previously described.

The fourth aspect of the present invention provides a gamma energy spectrometer comprising the scintillation detector as previously described.

The fifth aspect of the present invention provides an oil logging instrument comprising the scintillation detector as previously described.

The sixth aspect of the present invention provides a lithology scanning imager comprising the scintillation detector as previously described.

The technical solutions of the present invention achieve the following favorable technical effects: the rare earth halide scintillation material obtained by the present invention has excellent scintillation properties. Its comprehensive performance is significantly better than that of the conventional undoped lanthanum bromide crystal, the uniformity of the crystal is significantly better than that of the lanthanum bromide crystal doped with alkaline earth metal ion, and the growth yield of the crystal is also significantly increased.

DETAILED DESCRIPTION OF THE INVENTION

To further clarify the objective, technical solutions, and advantages of the present invention, a more detailed description of the invention will be conducted by reference to specific embodiments thereof. It should be understood that these descriptions are exemplary only, and are not intended to limit the scope of the present invention. Additionally, the descriptions of well-known structures and techniques are omitted in the following explanation in order to avoid undesirable confusion of the concepts of the present invention.

The first aspect of the present invention provides a rare earth halide scintillation material. The general chemical formula of the rare earth halide scintillation material is: $La_{1-x}Ce_xBr_{3+y}$, wherein $0.001 \leq x \leq 1$, $0.0001 \leq y \leq 0.1$.

In a further embodiment, $0.005 \leq x \leq 0.1$, $0.001 \leq y \leq 0.05$. In a further embodiment, preferably, $x=1$, $0.001 \leq y \leq 0.05$.

The above rare earth halide scintillation material may be in the form of powder, ceramic, or single crystal, but is preferably applied in a single crystal form, and the single crystal can be obtained by the Bridgman method.

A significant feature of the present invention is that the rare earth halide scintillation material provided hereby contains both $Ce^{3+}$ and $Ce^{4+}$, with the apparent valence state of Ce ions between +3 and +4. The present invention is intended to improve the performance of the rare earth halide scintillation material by adjusting the ratio of rare earth ions to halogen ions and modulating the proportion of $Ce^{4+}$.

The present invention can further improve the doping modification of $LaBr_3$:Ce crystals, and solve the problems of easy incurrence of growth defects and poor consistency in the scintillation performance caused by doping heterogeneous alkaline earth metal ions in $LaBr_3$:Ce crystals in the existing doping scheme. According to the embodiments of the present invention, the halogen ions in $LaBr_3$:Ce are excessive, deviating from its stoichiometric ratio of 3:1 with rare earth ions, inducing a portion of $Ce^{3+}$ to be converted into $Ce^{4+}$ based on charge balance, thereby improving the uniformity of crystal performance and effectively avoiding the problems of crystal growth defects and uneven segregation caused by heterogeneous doping.

According to the embodiments of the present invention, the following methods are employed to obtain the rare earth halide scintillation material having the chemical formula of $La_{1-x}Ce_xBr_{3+y}$.

Method 1: The anhydrous $LaBr_3$ and $CeBr_3$ feedstock used to grow $LaBr_3$:Ce crystals is heated in an environment containing $Br_2$ vapor, which absorbs a small amount of $Br_2$ vapor so that the molar ratio of Br to rare earth ions in the feedstock is greater than the stoichiometric ratio of 3:1. By controlling the $Br_2$ vapor concentration and the heating time, lanthanum bromide and cerium bromide feedstock with a different surplus of Br can be obtained. This Br-rich lanthanum bromide and cerium bromide feedstock can be employed to grow single crystal to obtain the rare earth halide scintillation materials with the chemical formula $La_{1-x}Ce_xBr_{3+y}$ described in the present invention.

Method 2: The stoichiometric $LaBr_3$ and $CeBr_3$ feedstock is employed to grow the $LaBr_3$:Ce crystals conforming to the stoichiometric ratio. Then the crystals are annealed in a dry inert gas (e.g., Ar gas) containing a portion of $Br_2$ vapor so that Br in the $LaBr_3$:Ce crystals exceeds the stoichiometric ratio, obtaining the rare earth halide scintillation material having the chemical formula of $La_{1-x}Ce_xBr_{3+y}$ as described in the present invention.

According to one embodiment of the present invention, the rare earth halide scintillation material obtained by the present invention has excellent scintillation properties. Its comprehensive performance is significantly better than that of the conventional undoped cerium bromide crystal, the uniformity of the crystal is significantly better than that of the cerium bromide crystal doped with alkaline earth metal ion, and the growth yield of the crystal is also significantly increased.

It is found that favorable implementation results can also be achieved when the technical idea of the present invention is applied to other Ce-activated rare earth halide scintillation materials.

It should be noted that the surplus y of Br ions in the present invention is limited to a relatively small range. In the present invention, the range of Br ion surplus is $0.0001 \leq y \leq 0.1$, preferably $0.001 \leq y \leq 0.05$. Within the range of the present invention, the crystals are colorless or light yellow and have excellent scintillation properties. However, an excessively high surplus of Br ions will cause the crystals to appear more pronounced yellow, and cause problems such as decreased light yield, poor energy resolution and prolonged decay time.

The present invention also relates to a scintillation detector comprising the above mentioned rare earth halide scintillation material, as well as PET scanners, gamma energy spectrometers, oil logging instruments or lithology scanning imagers comprising the scintillation detector.

The favorable effects of the present invention will be further illustrated below with reference to specific embodiments.

Comparative Example 1: 119.89 g of anhydrous $LaBr_3$ (99.99%) and 6.33 g of anhydrous $CeBr_3$ (99.99%) are accurately weighed in an Ar-filled glovebox. After mixed uniformly, they are loaded into a quartz crucible with the diameter of 25 mm. After the quartz crucible is taken out of the glovebox, it is immediately connected to the vacuum system to be vacuumized. Its opening is sealed by combustion when the vacuum degree reaches $1 \times 10^{-3}$ Pa. The quartz crucible is placed in a Bridgman crystal furnace for single crystal growth. The temperature of the high temperature zone is 850° C. and the temperature of the low temperature zone is 700° C. The temperature gradient of the gradient zone is about 10° C./cm, the crucible descending rate is 0.5-2 mm/h and the total growth time is about 15 days. The obtained crystals are transparent and colorless with a length of about 5 cm. The crystal is cut and processed in the glovebox into a cylindrical sample of Φ25 mm×25 mm for tests on the light yield, decay time and energy resolution and for analysis of the crystal composition.

Comparative Example 2: 119.89 g of anhydrous $LaBr_3$ (99.99%), 6.33 g of anhydrous $CeBr_3$ (99.99%) and 0.041 g of anhydrous $SrBr_2$ (99.99%) are accurately weighed in an Ar-filled glovebox. After mixed uniformly, they are loaded into a quartz crucible with the diameter of 25 mm. Other operations are the same as those in Comparative Example 1.

Example 1: 119.89 g of anhydrous $LaBr_3$ (99.99%) and 6.33 g of anhydrous $CeBr_3$ (99.99%) are accurately weighed in an Ar-filled glovebox. After mixed uniformly, they are loaded into a quartz crucible with the diameter of 25 mm. Other operations are the same as those in Comparative Example 1.

Examples 2-7: Except for the different ratio of raw materials, the other operations are the same as those in Example 1.

The detailed comparisons of all examples are shown in Table 1.

TABLE 1

| Ex. | Chemical Formula | Light Yield (ph/MeV) | Decay Time (ns) | Energy Resolution (@662 keV) |
|---|---|---|---|---|
| Comparative Example 1 | $La_{0.95}Ce_{0.05}Br_3$ | 56000 | 32 | 3.2% |
| Comparative Example 2 | $La_{0.95}Sr_{0.0005}Ce_{0.05}Br_{3.001}$ | 62000 | 30 | 2.7% |
| Example1 | $La_{0.95}Ce_{0.05}Br_{3.005}$ | 75000 | 18 | 2.0% |
| Example 2 | $La_{0.995}Ce_{0.005}Br_{3.0005}$ | 65000 | 25 | 2.5% |
| Example 3 | $La_{0.8}Ce_{0.2}Br_{3.1}$ | 66000 | 17 | 2.6% |
| Examplet 4 | $CeBr_{3.05}$ | 64000 | 16 | 3.5% |
| Example 5 | $La_{0.5}Ce_{0.5}Br_{3.02}$ | 65000 | 18 | 2.8% |

TABLE 1-continued

| Ex. | Chemical Formula | Light Yield (ph/MeV) | Decay Time (ns) | Energy Resolution (@662 keV) |
|---|---|---|---|---|
| Example 6 | $La_{0.9}Ce_{0.1}Br_{3.001}$ | 72000 | 24 | 2.2% |
| Example 7 | $La_{0.999}Ce_{0.001}Br_{3.0001}$ | 64000 | 23 | 2.5% |

To sum up, the present invention provides a rare earth halide scintillation material having a chemical formula of $La_{1-x}Ce_xBr_{3+y}$, wherein $0.001 \leq x \leq 1$, $0.0001 \leq y \leq 0.1$. The rare earth halide scintillation materials obtained by the present invention have excellent scintillation performance. Its comprehensive performance is significantly better than that of the conventional undoped lanthanum bromide crystal, the uniformity of the crystal is significantly better than that of the lanthanum bromide crystal doped with alkaline earth metal ion, and the growth yield of the crystal is also significantly increased.

It is to be understood that the foregoing detailed description of the present invention has been presented only for exemplary illustrations and explanations of the principles of the present invention, and not for the purpose of limiting the invention. Accordingly, any modifications, equivalent replacements and improvements, etc. which are made with the spirit and scope of the present invention, are supposed to be included within the protection scope of the present invention. Further, the appended claims of the present invention are intended to cover all such modifications and changes which fall within the scope and bound of the appended claims, or their equivalents.

The invention claimed is:

1. A rare earth halide scintillation material, wherein the rare earth halide scintillation material has a chemical formula of $La_{1-x}Ce_xBr_{3+y}$, wherein $0.005 \leq x \leq 0.1$, $0.001 \leq y \leq 0.05$.

2. The rare earth halide scintillation material of claim 1, wherein the described rare earth halide scintillation material contains $Ce^{3+}$ and $Ce^{4+}$ simultaneously.

3. The rare earth halide scintillation material of claim 2, wherein the rare earth halide scintillation material is a single crystal.

4. The rare earth halide scintillation material of claim 2, wherein the rare earth halide scintillation material is obtained by adopting a Bridgman method for growth.

5. The rare earth halide scintillation material of claim 1, wherein the rare earth halide scintillation material is a single crystal.

6. The rare earth halide scintillation material of claim 5, wherein the rare earth halide scintillation material is obtained by adopting a Bridgman method for growth.

7. The rare earth halide scintillation material of claim 1, wherein the rare earth halide scintillation material is obtained by adopting a Bridgman method for growth.

8. A scintillation detector, comprising the rare earth halide scintillation material of the claim 1.

9. A PET scanning imager, comprising the scintillation detector of claim 8.

10. A gamma energy spectrometer, comprising the scintillation detector of claim 8.

11. An oil logging instrument or a lithology scanning imager, comprising the scintillation detector of claim 8.

* * * * *